United States Patent
Kim et al.

(10) Patent No.: US 6,191,831 B1
(45) Date of Patent: Feb. 20, 2001

(54) LCD HAVING A PAIR OF TFTS IN EACH UNIT PIXEL WITH A COMMON SOURCE ELECTRODE

(75) Inventors: Sung Kon Kim; Gyo Un Choi, both of Seoul; Han Jin Lee; Han Jun Park, both of Kyoungki-do, all of (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/344,039

(22) Filed: Jun. 25, 1999

(30) Foreign Application Priority Data

Jun. 30, 1998 (KR) .................................................. 98-25852

(51) Int. Cl.[7] ...................... G02F 1/1333; G02F 1/1335; H01L 29/04
(52) U.S. Cl. .............................. 349/43; 349/48; 349/138; 257/59
(58) Field of Search ............................ 349/48, 43, 138; 257/59, 72

(56) References Cited

U.S. PATENT DOCUMENTS

| 4,678,281 | 7/1987 | Bauer . | |
|---|---|---|---|
| 5,066,106 | 11/1991 | Sakamoto et al. | 349/48 |
| 5,165,075 | * 11/1992 | Hiroki et al. | 349/48 |
| 5,191,453 | 3/1993 | Okumura | 349/43 |
| 5,383,041 | * 1/1995 | Yamazaki et al. | 349/48 |
| 5,432,527 | * 7/1995 | Yanai et al. | 349/48 |
| 5,581,382 | 12/1996 | Kim | 349/48 |
| 5,771,083 | 6/1998 | Fujihara et al. . | |
| 5,903,249 | * 5/1999 | Koyama et al. | 349/48 |
| 6,011,530 | * 1/2000 | Kawahata et al. | 349/48 |

FOREIGN PATENT DOCUMENTS

| 553137 | 3/1993 | (JP) . |
|---|---|---|
| 572995 | 3/1993 | (JP) . |

* cited by examiner

*Primary Examiner*—William L. Sikes
*Assistant Examiner*—Toan Ton
(74) *Attorney, Agent, or Firm*—Selitto & Associates

(57) ABSTRACT

Disclosed is a thin film transistor-liquid crystal display(TFT-LCD) having enhanced picture quality. The TFT-LCD comprises: an array substrate; a gate bus line disposed on the array substrate in a selected direction; a data bus line disposed to be crossed with the gate bus line; a pair of thin film transistors disposed at an intersection of the gate bus line and the data bus line and disposed at both sides of the data bus line respectively; a pixel electrode in contact with the respective thin film transistors; a gate insulating layer for insulating the gate bus line and the data bus line; and an intermetal insulating layer for insulating the data bus line and the pixel electrode, wherein the pair of thin film transistors have a source electrode in common.

11 Claims, 4 Drawing Sheets

FIG.2
(PRIOR ART)

| a1 | a2 | a3 |
|----|----|----|
| a4 | a5 | a6 |

LCD HAVING A PAIR OF TFTS IN EACH UNIT PIXEL WITH A COMMON SOURCE ELECTRODE

FIELD OF THE INVENTION

The present invention generally relates to a thin film transistor-liquid crystal display(TFT-LCD), and more particularly to a TFT-LCD capable of preventing the change of pixel voltage variation thereby improving picture quality of the TFT-LCD.

BACKGROUND OF THE INVENTION

The active matrix type LCD employing a thin film transistor having a number of pixels, has a thin and light device size and displays excellent picture quality comparable to the Cathode Ray Tube device.

FIG. 1 is a cross-sectional view showing a general TFT-LCD. As shown in the drawing, gate bus lines 12 are disposed on an array substrate 10 with a regular distance. Data bus lines 14 are disposed on the array substrate 10 to be disposed perpendicular to the gate bus lines 12 thereby defining pixels. A thin film transistor 15 is disposed at each intersection region of the gate bus line 12 and the data bus line 14. At this time, the thin film transistor 15 comprises a gate electrode 12a being extended from the gate bus line 12 toward the pixel region; a channel layer 16 being disposed over the gate electrode; a source electrode 14a being extended from the data bus line 14 to overlap one side of the channel layer 16; a drain electrode 14b to overlap the other side of the channel layer 16. A pixel electrode 18 is formed at each pixel region to be contacted with the drain electrode 14b of the thin film transistor.

Herein, the gate bus line 12, the data bus line 14, the channel layer 16 and the pixel electrode 18 are formed according to the photolithography process that is performed by coating a resist, developing and exposing the resist.

However, the mask used in the exposing step has a relatively small size compared to the dimension the array of substrate. Accordingly, the array substrate is divided into a selected number of pieces and the array substrate is exposed partially so as to form one type of pattern on the array substrate.

That is, as shown in FIG. 2, the array substrate 10 is divided into, for example, six pieces. Then, a mask(not shown) for forming pattern is arranged in a region a1 and exposed. Next, the mask moves to the respective regions a2,a3,a4,a5,a6 to perform exposing steps. Herein, the respective regions a1~a6 are called as "shots".

However, following problems are incurred due to the partial exposing step.

For example, when the masks are arranged for defining the data bus lines, there may be occurred misalignment, and the overlapping degree between the gate electrode 12a and the source electrode 14a is different from the respective shots a1~a6.

Accordingly, the values of parasitic capacitance Cgs (hereinafter "gate-source capacitance") of the respective shots are different from each other thereby changing pixel voltage variation(hereinafter "kick-back voltage") that relates to the picture quality of LCD device. Therefore, the picture quality of each shot is different and stains are occurred in the screen.

More particularly, the kick-back voltage can be understood with reference to following equation 1.

$$\Delta Vp = \frac{Cgs}{Cgs + Cst + Clc}(Vgh - Vgl) \quad \text{equation 1}$$

wherein, $\Delta Vp$ means the kick-back voltage,

Cgs means the parasitic capacitance between the gate electrode and the pixel electrode, Clc means a liquid crystal capacitance in the unit pixel, Cst means a storage capacitance in the unit pixel, Vgh means an ON voltage in the gate bus line, and Vbl means an OFF voltage in the gate bus line.

According to equation 1, the kick-back voltage $\Delta$ Vpis a function of the gate-source capacitance Cgs. When the capacitance Cgs is different in the respective shots, the kick-back voltage $\Delta$ Vp is also different in the respective shots and quality difference is occurred.

SUMMARY OF THE INVENTION

Accordingly, it is an object of the present invention to provide a TFT-LCD device capable of decreasing the quality difference in the shots.

Therefore, the present invention provides a TFT-LCD comprising:

an array substrate;

a gate bus line disposed on the array substrate in a selected direction;

a data bus line disposed to be crossed with the gate bus line;

a pair of thin film transistors disposed at an intersection of the gate bus line and the data bus line and disposed at both sides of the data bus line respectively;

a pixel electrode in contact with the respective thin film transistors;

a gate insulating layer for insulating the gate bus line and the data bus line; and an intermetal insulating layer for insulating the data bus line and the pixel electrode, wherein, the pair of thin film transistors have a source electrode in common.

The present invention further provides a TFT-LCD comprising:

an array substrate;

a gate bus line disposed on the array substrate in a selected direction;

a data bus line disposed to be crossed with the gate bus line;

a pair of thin film transistors disposed at an intersection of the gate bus line and the data bus line and disposed at both sides of the data bus line respectively;

a pixel electrode in contact with the respective thin film transistors;

a gate insulating layer for insulating the gate bus line and the data bus line; and an intermetal insulating layer for insulating the data bus line and the pixel electrode;

wherein the thin film transistors comprise a first gate electrode and a second gate electrode being extended from both sides of the gate bus line with respect to the data bus line; a first channel layer and a second channel layer disposed at the first gate electrode and the second gate electrode respectively; a common source electrode being extended from the data bus line to be overlapped with one sides of the first and second channel layers; and drain electrodes overlapped with the other sides of the first and second channel layers and contacted with the pixel electrode.

Herein, the data bus lines is disposed to pass along the center of the pixel electrode. Also, the pixel electrode is provided with recesses at the region in which the thin film transistor is disposed. The intermetal insulating layer is made of an organic insulating layer.

BRIEF DESCRIPTION OF THE DRAWINGS

Figure 2:
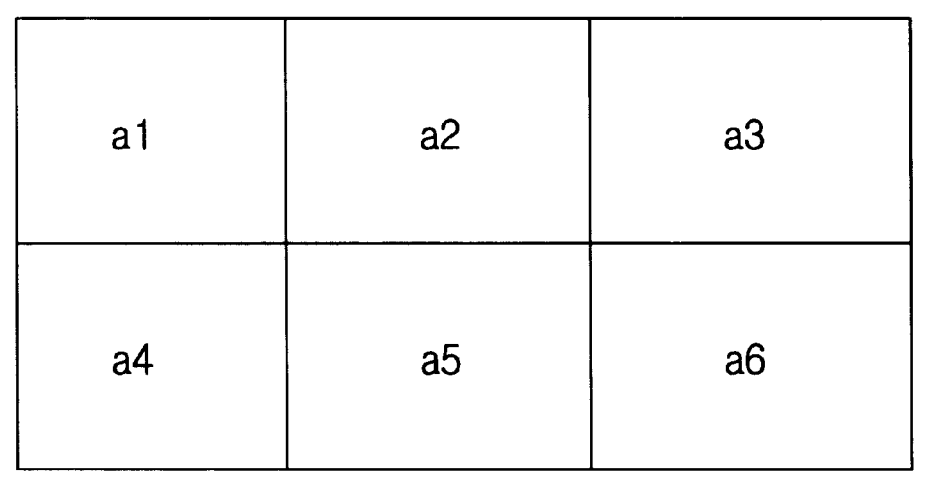

FIG. 2 illustrate the exposing step used for manufacturing the general TFT-LCD.

DETAILED DESCRIPTION OF THE PREFERRED EMBODIMENT

Hereinafter, the preferred embodiment of the present invention will be discussed with reference the to attached drawings.

Figure 1:
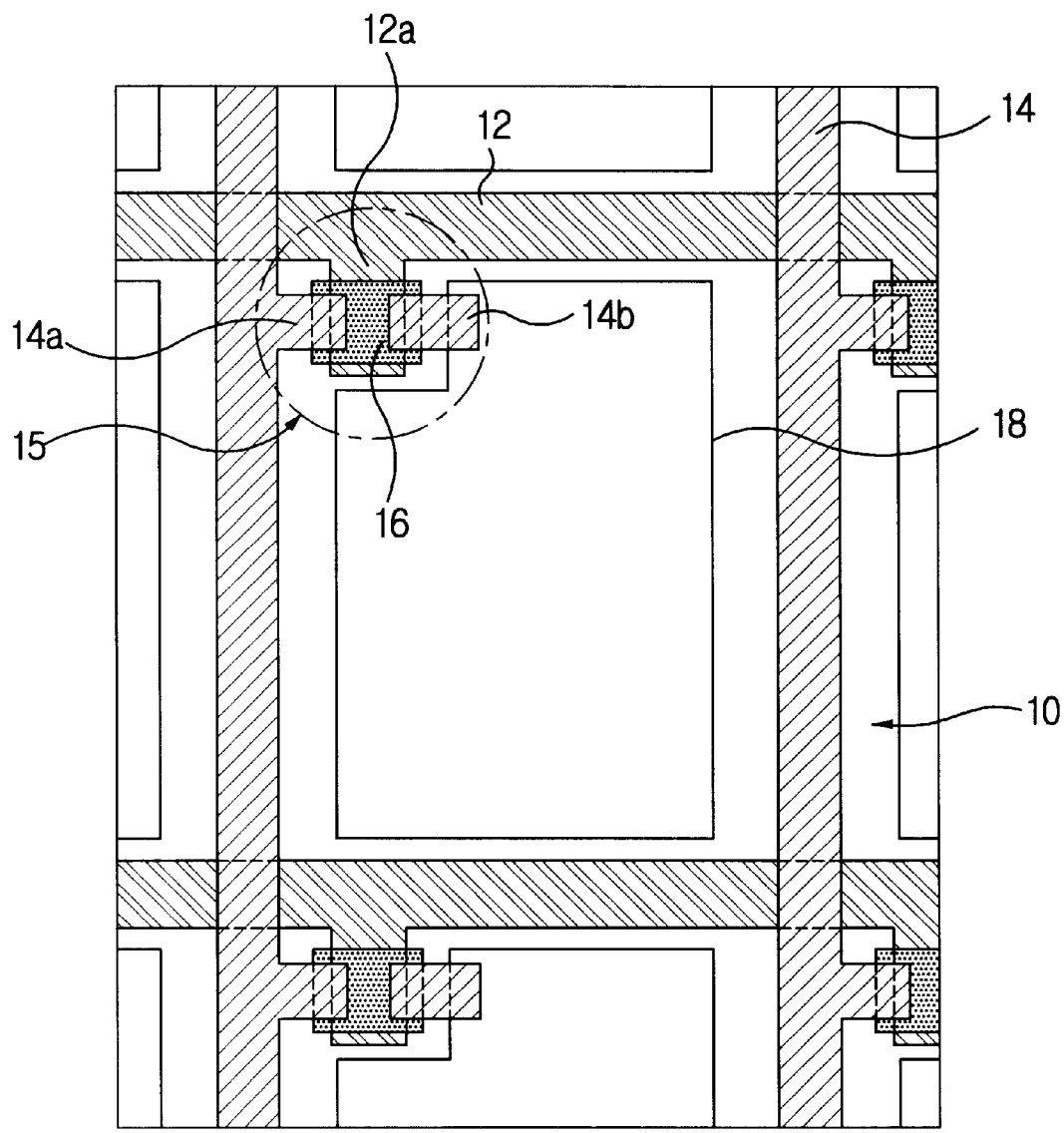
FIG. 1 is a cross-sectional view showing a general TFT-LCD.
Figure 3:
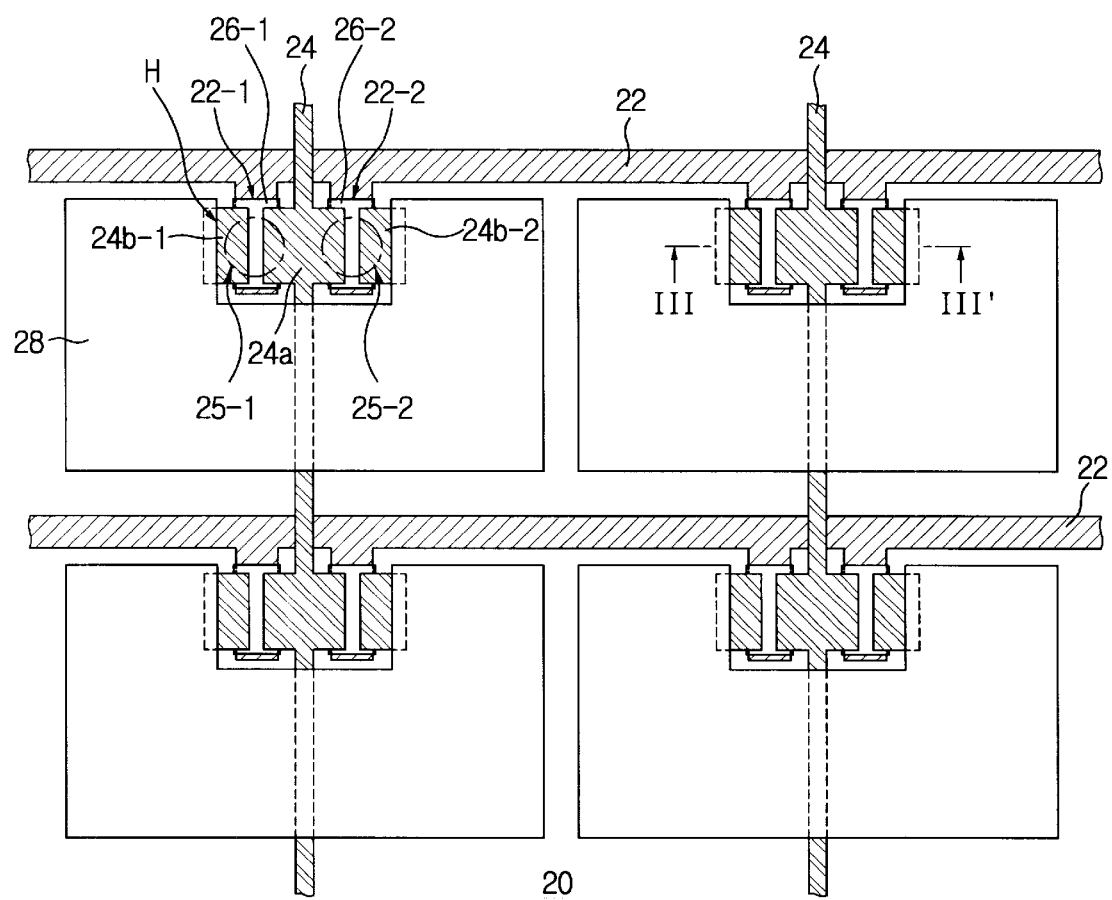
FIG. 3 is a cross-sectional view showing a TFT-LCD according to the present invention.

Referring to FIG. 3, gate bus lines 22 are arranged on an array substrate 20 with a selected distance. Data bus lines 24 are arranged on the array substrate 20 to be disposed perpendicular to the gate bus lines 22.

A first thin film transistor 25-1 and a second thin film transistor 25-2 are formed at each intersection of the gate bus line 22 and the data bus line 24. Herein, the thin film transistors 25-1,25-2 are disposed at both sides of the data bus line 24 respectively. The first and second thin film transistors 25-1,25-2 comprise first and second gate electrodes 22-1,22-2; first and second channel layers 26-1,26-2 formed on the first and second gate electrode 22-1,22-2; a common source electrode 24a extended from the data bus line 24 to overlap with one sides of the first and second channel layers 26-1,26-2; drain electrodes 24b-1,24b-2 to overlap with the other sides of the first and second channel layers 26-1,26-2. The gate electrodes 22-1,22-2 are formed at both sides of the data bus line 24.

A pixel electrode 28 is formed to be contacted with the drain electrodes 24b-1,24b-2 of the first and second thin film transistors 25-1,25-2 respectively. The pixel electrode 28 is overlapped with its corresponding data bus line and is made of transparent material. Herein, the data bus line 24 is disposed to pass along the center of the pixel electrode 28. Further, the pixel electrode 28 is formed in the shape of a plate provided with a recess H. The first and second thin film transistors 25-1,25-2 are disposed within the recess H.

Herein, a gate insulating layer(not shown) is sandwiched between the gate bus line 22 and the data bus line 24 thereby insulating the gate bus line 22 and the data bus line 24. Further, an organic insulating layer(not shown) is sandwiched between the data bus line 24 and the pixel electrode 28 thereby insulating the data bus line 24 and the pixel electrode 28 and the organic insulating layer acts for reducing capacitance of the parasitic capacitor occurred between the data bus line 24 and the pixel electrode 28.

The TFT-LCD as constituted above is formed according to the following method.

Figure 4:
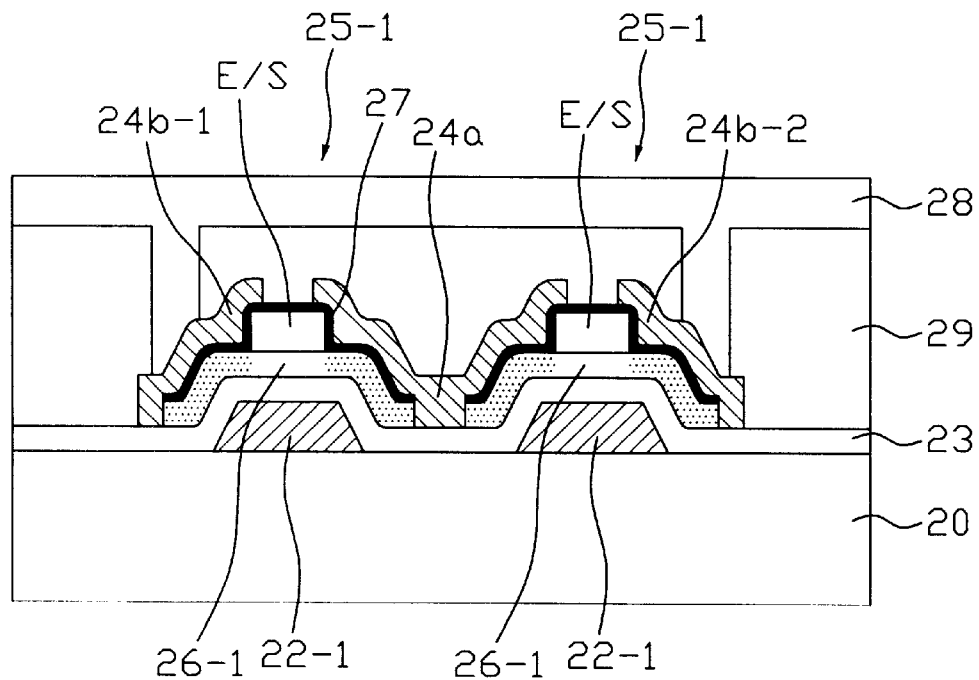
FIG. 4 is a cross-sectional view taken by a line III–III' of FIG. 3.

Referring to FIG. 4, a metal layer is formed on the array substrate 20 and the gate electrodes 22-1,22-2 are formed by patterning a selected portion of the metal layer. A gate bus line(not shown) is formed simultaneously at the time the gate electrodes 22-1,22-2 are formed. The gate insulating layer 23 is formed on the array substrate in which the gate electrodes 22-1,22-2 are formed. Next, a silicon layer for channel layer is deposited on the gate insulating layer 23, and an etch stopper E/S is formed on a selected portion of the silicon layer for channel according to a known method. The etch stopper E/S has a width that is equal to or smaller than that of the gate electrodes 22-1,22-2. Impurities are ion-implanted to the silicon layer for channel on both sides of the etch stopper E/S thereby forming source and drain regions. Afterward, a doped semiconductor layer is formed on the silicon layer for channel and on the etch stopper E/S. The doped semiconductor layer and the silicon layer for channel are patterned in some portions thereof so as to cover the gate electrodes 22-1,22-2 thereby forming an ohmic layer 27 and channel layers 26-1,26-2. Thereafter, a metal layer is formed on the array substrate 20 and the metal layer is patterned in some portions thereof so that the metal layer is disposed at both sides of the etch stopper E/S thereby forming a source electrode 24a and drain electrodes 24b-1, 24b-2. At this time, a data bus line is formed at the same time as the source electrode 24a and drain electrodes 24b-1,24b-2 are formed. Next, the organic insulating layer 29 is coated on a resultant of the array substrate 20. At this time, the organic insulating layer 29 is coated at a thickness of over 1 $\mu$m and the array substrate 20 has an even surface according to the planarization of the organic insulating layer 29. Afterward, the organic insulating layer 29 is etched to expose the drain electrodes 24b-1,24b-2. The pixel electrode 28 is formed on the organic insulating layer 29 to be contacted with the exposed drain electrodes 24b-1,24b-2.

Operation of the TFT-LCD as manufactured above is as follows.

According to the present embodiment, two thin film transistors 25-1,25-2 are formed on one pixel electrode 28.

Although, there is any change in the gate-source capacitance Cgs1 of the first thin film transistor 25-1 due to the misalignment of the mask for defining the data bus lines, the gate-source capacitance Cgs2 of the second thin film transistor 25-2 is changed to compensate the change in the capacitance Cgs1 of the first thin film transistor 25-1.

That is to say, in the present embodiment, a gate-source capacitance Cgs of a unit pixel is the total of the gate-source capacitance Cgs1 of the first thin film transistor 25-1 and the gate-source capacitance Cgs2 of the second thin film transistor 25-2. At this time, the source electrode 24a can be commonly applied to both first and second thin film transistors 25-1,25-2. Therefore, for instance, when the overlapping degree of the first gate electrode 22a with the source electrode 24a is decreased, the overlapping degree of the second gate electrode 22b with the source electrode 24a is increased relatively. Accordingly, although the misalignment of the mask is occurred, the gate-source parasitic capacitance Cgs of the unit pixel is maintained at a selected degree.

As described above in detail, according to the present invention, two thin film transistors as switching means for controlling one pixel electrode are formed in a unit pixel and the thin film transistors have a source electrode in common. Although, there is any change in the gate-source capacitance Cgs1 of the first thin film transistor 25-1 due to the misalignment of the mask for defining the data bus lines, the gate-source capacitance Cgs2 of the second thin film transistor 25-2 is changed to compensate the change of the capacitance Cgs1 of the first thin film transistor 25-1. Therefore, the kick-back voltage in the unit pixel is maintained at a constant degree. Accordingly, the picture quality of the TFT-LCD is improved since the difference of brightness in the respective shots is decreased.

Various other modifications will be apparent to and can be readily made by those skilled in the art without departing from the scope and spirit of the present invention.

What is claimed is:

1. A thin film transistor-liquid crystal display (TFT-LCD) comprising:
   an array substrate;
   a gate bus line disposed on the array substrate in a selected direction;
   a data bus line disposed so as to be crossed with the gate bus line;
   a pair of thin film transistors disposed adjacent an intersection of the gate bus line and the data bus line and disposed in a unit pixel on opposite sides of the data bus line;
   a pixel electrode in contact with the thin film transistors;
   a gate insulating layer for insulating the gate bus line and the data bus line; and
   an intermetal insulating layer for insulating the data bus line and the pixel electrode,
   the pair of thin film transistors having a source electrode directly connected to both of the thin film transistors such that the source electrode is common to both of the thin film transistors.

2. The TFT-LCD of claim 1, wherein the thin film transistors include a first gate electrode and a second gate electrode extending from the gate bus line; a first channel layer and a second channel layer disposed at the first gate electrode and the second gate electrode respectively; and a first drain electrode and a second drain electrode overlapped with first sides of the first and second channel layers, respectively; and being in contact with the pixel electrode, the source electrode extending from the data bus line so as to be overlapped with second sides of the first and second channel layers.

3. The TFT-LCD of claim 1, wherein the data bus line is disposed to pass along a center of the pixel electrode.

4. The TFT-LCD of claim 3, wherein the pixel electrode has a recess, and the thin film transistors are disposed in the recess of the pixel electrode.

5. The TFT-LCD of claim 1, wherein the intermetal insulating layer is an organic insulating layer.

6. The TFT-LCD of claim 1, wherein the source electrode extends from the data bus line towards the thin film transistors.

7. The TFT-LCD of claim 6, wherein each of the thin film transistor includes a channel layer; and wherein the source electrode includes a first portion, which is overlapped with the channel layer of one of the thin film transistors, and a second portion, which is overlapped with the channel layer of another of the thin film transistors.

8. A TFT-LCD comprising:
   an array substrate;
   a gate bus line disposed on the array substrate in a selected direction;
   a data bus line disposed so as to be crossed with the gate bus line;
   a pair of thin film transistors disposed adjacent an intersection of the gate bus line and the data bus line and disposed on opposite sides of the data bus line;
   a pixel electrode in contact with the thin film transistors;
   a gate insulating layer for insulating the gate bus line and the data bus line; and
   an intermetal insulating layer for insulating the data bus line and the pixel electrode,
   the pair of thin film transistors including a first gate electrode and a second gate electrode extending from the gate bus line; a first channel layer and a second channel layer disposed at the first gate electrode and the second gate electrode, respectively; a common source electrode extending from the data bus line to be overlapped with first sides of the first and second channel layers; and a first drain electrode and a second drain electrode overlapped with second sides of the first and second channel layers, respectively, and being in contact with the pixel electrode.

9. The TFT-LCD of claim 8, wherein the data bus line is disposed to pass along a center of the pixel electrode.

10. The TFT-LCD of claim 9, wherein the pixel electrode has a recess, and the thin film transistors are disposed in the recess of the pixel electrodes.

11. The TFT-LCD of claim 8, wherein the intermetal insulating layer is an organic insulating layer.

* * * * *